United States Patent
Armbruster et al.

(10) Patent No.: US 11,652,661 B2
(45) Date of Patent: May 16, 2023

(54) INTERFACE EXPANSION DEVICE FOR A NETWORK DEVICE

(71) Applicant: SIEMENS AKTIENGESELLSCHAFT, Munich (DE)

(72) Inventors: Michael Armbruster, Munich (DE); Andreas Zirkler, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 565 days.

(21) Appl. No.: 15/737,411

(22) PCT Filed: May 19, 2016

(86) PCT No.: PCT/EP2016/061288
§ 371 (c)(1),
(2) Date: Dec. 18, 2017

(87) PCT Pub. No.: WO2016/206875
PCT Pub. Date: Dec. 29, 2016

(65) Prior Publication Data
US 2018/0176035 A1 Jun. 21, 2018

(30) Foreign Application Priority Data
Jun. 22, 2015 (DE) .......................... 102015211478.3

(51) Int. Cl.
*H04L 12/40* (2006.01)
*G01R 19/00* (2006.01)
(Continued)

(52) U.S. Cl.
CPC .... *H04L 12/40032* (2013.01); *G01R 19/0092* (2013.01); *G06F 9/3885* (2013.01);
(Continued)

(58) Field of Classification Search
CPC ......... H04L 12/40032; H04L 12/40176; H04L 12/40045; H04L 12/40169; H04L 12/10; G06F 9/3885; G01R 19/0092
See application file for complete search history.

(56) References Cited

U.S. PATENT DOCUMENTS 6,489,693 B1 12/2002 Hetzler
7,426,374 B2 9/2008 Dwelley
(Continued)

FOREIGN PATENT DOCUMENTS

CN 101129019 A 2/2008
CN 101834727 A 9/2010
(Continued)

OTHER PUBLICATIONS

PCT International Search Report and Written Opinion of the International Searching Authority dated Aug. 19, 2016 for corresponding PCT/EP2016/061288.

*Primary Examiner* — Ricardo H Castaneyra
(74) *Attorney, Agent, or Firm* — Lempia Summerfield Katz LLC

(57) ABSTRACT

The claimed interface extension device is based on a network device (DCC) having at least one previously unoccupied digital data output (OUT), to which an interface extension module (IOE) having at least one supply voltage input (S) and having a plurality of digital interfaces is coupled in the claimed manner. In this way, the supply voltage input (S) of the interface extension module (IOE) is interconnected with the digital data output (OUT) of the network device (DCC), so that in event of an error, the interface extension module (IOE) and all the digital interfaces thereof can be switched off. In addition, by measuring the sum current flowing through the outputs of the interface extension module, the load diagnosis capacity of the network configuration can be extended to the interface extension device. The (Continued)

claimed interconnection of the supply voltage input (S) of the interface extension module with the digital data output (OUT) of the network configuration has the advantage of also implementing a fail-safe behavior for conventional interface extension modules.

5 Claims, 1 Drawing Sheet

(51) Int. Cl.
  *H04L 12/10* (2006.01)
  *G06F 9/38* (2018.01)
(52) U.S. Cl.
  CPC ........ *H04L 12/10* (2013.01); *H04L 12/40045* (2013.01); *H04L 12/40169* (2013.01); *H04L 12/40176* (2013.01)

(56) References Cited

U.S. PATENT DOCUMENTS

| | | |
|---|---|---|
| 2010/0231054 A1 | 9/2010 | Togawa |
| 2013/0322434 A1 | 12/2013 | Armbruster et al. |
| 2014/0265550 A1 | 9/2014 | Milligan |
| 2014/0350781 A1 | 11/2014 | Mehringer et al. |

FOREIGN PATENT DOCUMENTS

| | | |
|---|---|---|
| CN | 102136915 A | 7/2011 |
| CN | 103874927 A | 6/2014 |
| DE | 102012209108 A1 | 12/2013 |
| EP | 1030185 A2 | 8/2000 |
| WO | WO2011151773 A1 | 12/2011 |

INTERFACE EXPANSION DEVICE FOR A NETWORK DEVICE

CROSS REFERENCE TO RELATED APPLICATIONS

The present patent document is a § 371 nationalization of PCT Application Serial Number PCT/EP2016/061288, filed May 19, 2016, designating the United States, which is hereby incorporated by reference in its entirety. This patent document also claims the benefit of DE 102015211478.3, filed on Jun. 22, 2015, which is also hereby incorporated by reference in its entirety.

FIELD

Embodiments relate to an interface expansion device for a network device.

BACKGROUND

In safety-relevant networks, such as in automation installations or in the automotive vehicle sector, for example, safety-relevant data is transmitted even in the case of faults in hardware components or transmission paths. In safety-relevant networks, the operation of a plurality of network devices connected in a ring-shaped topology is known.

A further measure for increasing safety is provided by redundant data processing within a network device. A network device, also known as a duplex controller, includes control devices operating in parallel, e.g. microprocessors operating in parallel or else microprocessor cores of a multi-core processor operating in parallel, on which redundant data processing is performed on two isolated execution lanes. Two processes associated with a respective execution lane monitor one another with respect to the data supplied and the data guided away. In the event of a deviation, a fault is identified, and the results calculated on the two execution lanes are discarded. Such a measure is referred to as failsafe.

To provide more stringent fail-operational behavior, there may additionally be a further control device operating in parallel to take over the control operation in the event of the aforementioned deviation.

Network devices of the aforementioned type may be used in safety-relevant networks in the future, for example in the vehicle sector, and are currently being developed in the RACE (Robust and Reliable Automotive Computing Environment for Future E-Cars) project. The network devices may include a plurality of digital interfaces, e.g. digital inputs and/or outputs, that are provided with redundant safety mechanisms.

In practice, however, the need for digital interfaces, for example for the purpose of integrating different modules, sensors and actuators, often exceeds a number of interfaces provided by the network devices. Compensation for the lack of interfaces by adding additional network devices and using the digital interfaces of the additional network devices often fails for reasons of cost.

Furthermore, to optimize a cable harness in a vehicle, a plurality of interface modules or I/O (input/output) modules may be distributed in a vehicle and thus may include short cable connections between interface modules and units connected thereto. Adding additional network devices may exceed a prescribed budget.

In contrast, the use of commercially available interface modules, for example by multiplex operation of a plurality of interface modules at an interface of a network device, is not compatible with the overall safety concept of the network, since commercially available interface modules are not suitable for ensuring the aforementioned safety mechanisms without providing additional measures.

SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide an interface expansion device, that has safety mechanisms of a safety-relevant network.

The interface expansion device is based on a network device including at least one previously unassigned digital data output, to which an interface expansion module including at least one supply voltage input and including a plurality of digital expansion interfaces is coupled. The supply voltage input of the interface expansion module may be interconnected with the digital data output of the network device, with the result that, in the event of a fault, the interface expansion module with all of the expansion interfaces thereof may be disconnected.

The interconnection of the supply voltage input of the interface expansion module with the digital data output of the network device provides failsafe behavior for conventional interface expansion modules as well. In the event of a fault identified by the network device, the redundant safety mechanisms of the network device may also safely disconnect the expansion interfaces of the interface expansion module. All interfaces, for example, outputs, of the interface expansion modules are disconnected by disconnecting the data output, which delivers the supply voltage to the interface expansion module. The disconnection also occurs, for example, if the interface expansion module is faulty. The interface expansion device thus provides the required safety mechanisms of the safety-relevant network.

Although simultaneously disconnecting all the expansion interfaces of the interface expansion module does not ensure optimum availability of the expansion interfaces within the context of fail-operational behavior, a safe failsafe state in the event of a fault may be provided.

If fail-operational behavior is required for individual expansion interfaces in the event of a fault, the expansion interfaces are kept available on a redundant basis in accordance with an embodiment. The expansion interfaces are configured in a redundant manner such that the second expansion interface that is redundant with respect to a first expansion interface is actuated by a second network device that is expanded using the interface expansion device.

In an embodiment, a load diagnosis device that is associated with the data output of the network device, for measuring a summation current of all the partial currents of the expansion interfaces of the interface expansion module that flow via the digital data output of the network device is used. The measure provides the possibilities of load diagnosis that is implemented for data outputs of the network device to also be opened up for the expansion interfaces, for example, for the data outputs of the interface expansion module.

Load diagnosis provides identification of an interruption of the line connection to a load connected to the data output or provides a short circuit of the data output, to which the load is connected, with respect to a supply potential or with respect to a reference-ground potential. The load diagnosis may be used to measure the current that flows via the data output for diagnosis purposes.

A connection of the expansion module may be used to perform load diagnosis over all the expansion interfaces of the interface expansion module. Although the loads at each individual expansion interface may not be detected independently, the detection of a total load allows conclusions to be drawn about the load of each individual expansion module via the sum of the currents flowing:

Switching a data output of the expansion module leads to a change in the sum of the current flowing, with the result that load diagnosis also allows conclusions to be drawn about the load of individual data outputs of the expansion interfaces.

Measuring the consumption of the entire expansion module permits conclusions to be drawn about individual expansion interfaces by solving the following equation for the total power Ptotal:

$$Ptotal = Pmodule + \text{switching } \eta \sum_{1}^{n} staten * Pn$$

where:
Pmodule=self-consumption of the expansion module
n=number of outgoing expansion interfaces
η=efficiency of outgoing expansion interfaces
switching staten={in|out}
Pn=power of the load connected to the expansion interface n Deviations from the condition indicate the fault in a load. Brief switching of individual expansion interfaces makes it possible to diagnose, in a targeted manner, which expansion interface or which load connected to the respective expansion interface is faulty, if it is not possible to identify the fault already using the above formula by different current recordings of the various loads or the switching processes resulting from the operation.

DETAILED DESCRIPTION

Figure 1:
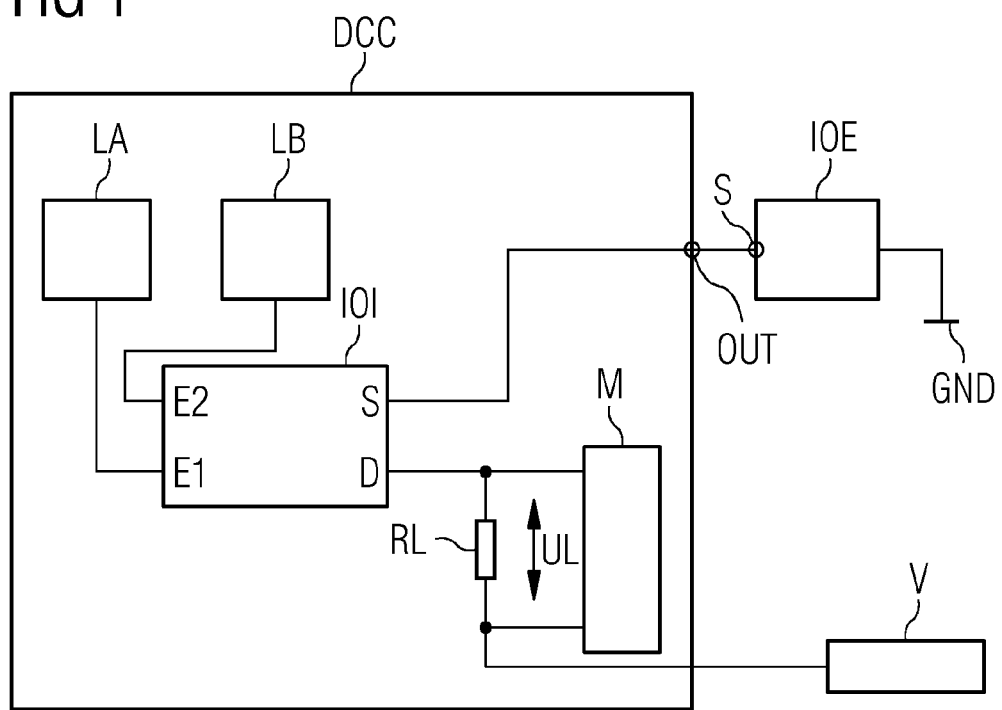
FIG. 1 depicts a schematic illustration of an embodiment of an interface expansion device.

FIG. 1 depicts an embodiment of an interface expansion device. In the embodiment, a network device DCC, also known as a duplex controller, includes control devices (not illustrated) operating in parallel, e.g. microprocessors operating in parallel or microprocessor cores of a multi-core processor operating in parallel, on which redundant data processing is performed on two isolated execution lanes LA, LB.

A first execution lane LA is at least temporarily connected to a first control input E1 (Enable) of a network-device-internal interface modular unit IOI. A second execution lane LB is at least temporarily connected to a second control input E2 of the network-device-internal interface modular unit IOI.

Only one load connection terminal pair S, D is depicted for the interface modular unit IOI, where a first load connection terminal S is conducted to the outside as a digital data output OUT of the network device DCC. The first load connection terminal S corresponds, for example, to a source terminal of a semiconductor power switch. In the configuration, a second load connection terminal D is connected to the supply potential V of a voltage supply by a load resistor RL. The second load connection terminal D corresponds, for example, to a drain terminal of a semiconductor power switch.

All the digital data outputs of the network device DCC (only one data output OUT is depicted in FIG. 1 for clarity) are actuated by the two redundant execution lanes LA, LB of the network device via the interface modular unit IOI. Merely actuating the redundant control inputs E1, E2 by the two execution lanes LA, LB leads to the switching of an output OUT actuated. In an embodiment, an output actuated in this way may be read-back on a two-channel basis in order to be able to identify the switching state reliably.

A further measure for increasing safety is provided by load analysis of the digital data output OUT. In load diagnosis, the current that flows through the data output OUT is measured in order to identify whether a load connected thereto is operating correctly.

Corresponding safeguarding measures are also provided on the input side of digital inputs (not illustrated) of the network device DCC. A digital input is read-in on a two-channel basis. Faults may be identified with a very high degree of probability to reliably rule out undesired switching-on of consumers within the context of a failsafe measure and/or to identify a faulty consumer. The latter is a prerequisite for fault identification and a suitable reaction to a fault.

A load diagnosis device M is connected in parallel with the load resistor RL and provides identification of an interruption in the line connection to a load connected to the data output OUT or provides a short circuit of the data output OUT, to which the load is connected, with respect to a reference-ground potential GND (ground) or with respect to the supply potential V. The load diagnosis device M may be used to determine the current that flows through the data output OUT by measuring a voltage UL dropped across the load resistor RL. The load diagnosis device may optionally be configured on a two-channel basis.

In an embodiment, an interface expansion module IOE is connected to the network device DCC to the effect that the supply voltage input S of the interface expansion module IOE is not connected to the supply potential V of the voltage supply (e.g., in vehicles, terminal 15 or terminal 30), but instead, is connected to the digital data output OUT of the network device DCC. The individual interface ports, e.g. digital inputs and/or outputs, of the interface expansion module IOE are not depicted in FIG. 1 for reasons of clarity.

In FIG. 1, a load connected to the digital data output OUT, with the load formed by the interface expansion module IOE, is positioned between the first load connection terminal S of the semiconductor power switch and the reference-ground potential GND. The configuration may be referred to as a high-side switch.

Figure 2:
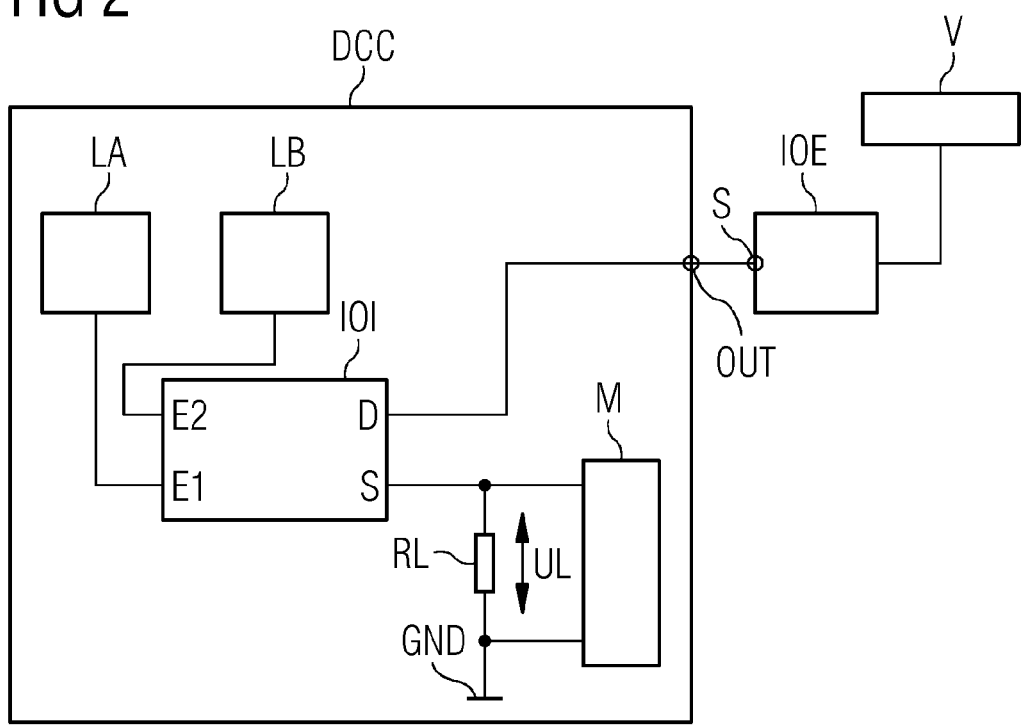
FIG. 2 depicts a schematic illustration of an embodiment of an interface expansion device.

FIG. 2 depicts an alternative embodiment of the digital data output OUT. In FIG. 2, a load connected to the digital data output OUT, with the load being formed by the interface expansion module IOE, is positioned between a second load connection terminal D of the semiconductor power switch and the supply potential V. The configuration may be referred to as a low-side switch.

In the configuration of the digital data output OUT as a low-side switch in accordance with FIG. 2, a load diagnosis device M is connected in parallel with the load resistor RL. The load diagnosis device M provides identification of an interruption in the line connection to a load connected to the data output OUT or provides a short circuit of the data output OUT, to which the load is connected, with respect to the supply potential V. The load diagnosis device M is used to determine the current that flows through the data output OUT by measuring a voltage UL dropped across the load resistor RL.

Although the redundant data processing within the network device DCC, e.g. the redundant execution lanes LA, LB, and an implementation of microprocessors operating in parallel or else microprocessor cores of a multi-core processor operating in parallel expand the safety measures to the interface expansion device, embodiments are not restricted to the implementation of the network device as a duplex controller, as described in the embodiment. Embodiments provide for use in non-redundantly designed network devices of any type (e.g., based on a single microcontroller). It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A system comprising:
a network device, the network device comprising at least one digital data output and a load diagnosis device that is associated with the at least one digital data output, the load diagnosis device configured to detect a fault as a function of a deviation in a summation current of all partial currents of a plurality of expansion interfaces of an interface expansion module that flow via the at least one digital data output of the network device; and
the interface expansion module, the interface expansion module comprising a plurality of expansion interfaces and at least one supply voltage input that is interconnected with the at least one digital data output of the network device to receive a supply voltage;
wherein in the event of the fault detected by the network device, the at least one digital data output and the interface expansion module with all expansion interfaces of the plurality of expansion interfaces are disconnected.

2. A method for operating an interface expansion device for a network device, the interface expansion device comprising at least one digital data output, the interface expansion device further comprising an interface expansion module, the interface expansion module comprising at least one supply voltage input and a plurality of expansion interfaces, at least one supply voltage input of the interface expansion module being interconnected with a digital data output of the at least one digital data output of the network device, the method comprising:
measuring, by a load diagnosis device that is associated with the digital data output, a summation current of all partial currents of the plurality of expansion interfaces that flow via the digital data output of the network device;
detecting a fault event by the load diagnosis device as a function of the measurement; and
disconnecting, after detection of the fault event, the digital data output and the interface expansion module with all expansion interfaces of the plurality of expansion interface.

3. The method of claim 2 wherein the fault event is detected if no change in the summation current is measured when switching at least one outgoing expansion interface of the interface expansion module.

4. The method of claim 2 wherein the fault event is detected if the summation current measured by the load diagnosis device does not correspond to an expected summation current of all partial currents that flow via the digital data output of the network device.

5. The method of claim 2 wherein the fault event is detected if the summation current measured by the load diagnosis device does not correspond to an expected summation current of all partial currents that flow via the digital data output of the network device.

* * * * *